United States Patent
Bezzetto (12)

(10) Patent No.: US 6,387,181 B1
(45) Date of Patent: May 14, 2002

(54) COATING DEVICE FOR COATING SOLDER RESIST ON BOTH SIDES OF A PRINTED CIRCUIT BOARD

(76) Inventor: Sandro Bezzetto, Viale Ungheria 69, 37050 Cerea (IT)

( * ) Notice: Subject to any disclaimer, the term of this patent is extended or adjusted under 35 U.S.C. 154(b) by 0 days.

(21) Appl. No.: 09/380,077

(22) PCT Filed: Feb. 25, 1998

(86) PCT No.: PCT/EP98/01074

§ 371 Date: Nov. 22, 1999

§ 102(e) Date: Nov. 22, 1999

(87) PCT Pub. No.: WO98/38842

PCT Pub. Date: Sep. 3, 1998

(30) Foreign Application Priority Data

Feb. 25, 1997 (DE) ..................................... 297 03 356 U

(51) Int. Cl.[7] .................................................. B05C 1/08
(52) U.S. Cl. ....................... 118/227; 118/226; 118/213; 118/207; 118/216
(58) Field of Search ................................ 118/207, 216, 118/225, 226, 227, 228, 322, 324, 249, 259, 213, 64

(56) References Cited

U.S. PATENT DOCUMENTS

| 4,500,082 A | * | 2/1985 | Izume | 270/20.1 |
|---|---|---|---|---|
| 5,184,907 A | * | 2/1993 | Hamada et al. | 400/635 |
| 5,637,148 A | * | 6/1997 | Kuster et al. | 118/64 |
| 5,912,984 A | * | 6/1999 | Michael et al. | 382/149 |

FOREIGN PATENT DOCUMENTS

| DE | 19704 260 A1 | 2/1997 |
|---|---|---|
| EP | 0 392 625 A1 | 10/1990 |
| WO | WO 95/11581 | 4/1995 |

* cited by examiner

*Primary Examiner*—Richard Crispino
*Assistant Examiner*—Yewebdar T Tadesse
(74) *Attorney, Agent, or Firm*—Moser, Patterson & Sheridan, L.L.P.

(57) ABSTRACT

An application device for applying at least a solder resist onto both surfaces of a printed circuit board that are in particular provided with structurized printed conductors comprises at least two application bodies that can be assigned to the corresponding surface of the board and are rotatably supported. To simplify the structure of the application device while allowing a more rapid and well-reproducible application at both sides of a printed circuit board at the same time, the application bodies are two screen printing drums arranged at both sides of an essentially horizontal transport path of the printed circuit board, wherein a transport means comprises conveyor belts along the transport path for transporting the printed circuit board, and the transport means further comprises pressing means that can be pressed onto a surface of the board for holding the board on the conveyor belts.

13 Claims, 2 Drawing Sheets

COATING DEVICE FOR COATING SOLDER RESIST ON BOTH SIDES OF A PRINTED CIRCUIT BOARD

The present invention relates to an application device for applying at least a solder resist onto both surfaces of a printed circuit board that are in particular provided with structurized printed conductors, the application device comprising at least two application bodies that can be assigned to the corresponding surface of the board and are rotatably supported.

In such an application device which is known in practice, an upper surface and a lower surface of the board are coated, for instance, by two printing rollers with solder resist applied to the outer surface thereof. The coating with the solder resist serves to protect all parts on the printed circuit board, except for those in which electric or electronic components are to be soldered.

The known application device has the disadvantage that the working speed is relatively small with such printing rollers and that the production of the printing rollers as well as the application of solder resist to an outer circumference of the rollers are relatively troublesome and difficult at the same time. Moreover, it is relatively difficult to control the thickness of the applied solder resist.

It is therefore the object of the present invention to improve an application device of the above-mentioned type in such a manner that said device has a simplified structure while allowing a more rapid and well-reproducible application, in particular, of a solder resist at both sides of a printed circuit board at the same time.

This object is achieved in that the application bodies are two screen printing drums arranged on both sides of an essentially horizontal transport path, wherein a transport means comprises conveyor belts along the transport path and the transport means further comprises pressing means adapted to be pressed onto a surface of the board for holding the printed circuit board on the conveyor belts.

Thanks to the arrangement of the application bodies at both sides, solder resist, in particular, is applied at the same time. Thanks to the horizontal transport path the solder resist will adhere to the surfaces of the board in an optimum manner, whereby the coating can simultaneously be applied to both surfaces of the printed circuit board in a uniform and constant manner due to the use of the screen printing drums. Moreover, a high speed can be achieved during application through the use of the screen printing drums, and the application device according to the invention can be constructed and used in a simplified manner at the same time and is thus less expensive than the prior-art application device comprising printing rollers.

Moreover, thanks to the simultaneous, uniform and constant application, in particular of solder resist, both surfaces of the printed circuit board can be dried at the same time and during the same period of time, thereby avoiding different degrees of sensitivity during subsequent exposure and corresponding development for the further structurization of the surfaces of the printed circuit board.

Moreover, thanks to the essentially horizontal transport path, known and already well-established devices can be used for the supply to and the discharge from the screen printing drums. The costs of the application device are thereby further reduced.

To transport and hold the printed circuit boards in an easy manner, the transport means comprises conveyor belts extending along the transport path as well as pressing means which can be pressed onto a surface of the board for holding the printed circuit board on the conveyor belts. Preferably, the pressing means press against an upper surface of the board opposite to the conveyor belts.

For the use of printed circuit boards having different dimensions and, in particular, different thicknesses, and for improved accessibility of the screen printing drums for repair, cleaning, or the like, at least one screen printing drum can be adjustably supported essentially in a direction perpendicular to the transport direction. In cases where only one screen printing drum is adjustably supported, the structure of the application device is further simplified.

The printed circuit boards are transported to the printing gap formed by the two screen printing drums, along their essentially horizontal transport path. To be able to print, if possible, on the whole upper and lower surface of the board, the horizontal transport path may be defined by the transport means which supports and/or holds at least edge portions or edges of the printed circuit board. On account of the small weight of the printed circuit board it is e.g. sufficient when a corresponding transport means presses from the outside onto the opposite edges of the printed circuit board that are positioned in parallel with the transport means, and when the transport means moves the board. The transport means can also act on the upper and lower surface of the board within a small edge portion of the printed circuit board as long as solder resist, for instance, need not be applied in said edge portion. Furthermore, transport means for edge portions and edge of the printed circuit board can be used in combination simultaneously or successively along the transport path.

Further possible configurations of the transport means and combinations thereof are obvious.

A transport means may e.g. be formed by transport wheels which press onto an outer edge of the printed circuit board. Moreover, the transport means may be provided along the transport path with conveyor belts which support the edge portions of the printed circuit board and/or which press against the outer edge of the printed circuit board.

Further possible configurations of the transport means and combinations thereof are obvious.

In the case of conveyor belts assigned to edge portions on the lower surface of the board, it may turn out to be an advantage when for a positionally accurate supply which is synchronized with the rotation of the screen printing drum, the transport means comprises pressing means adapted to be pressed onto the upper surface of the board for holding the printed circuit board on the conveyor belts.

Such pressing means may e.g. be pressing elements which can be assigned to an edge portion of the upper surface of the board. Moreover, the pressing means may comprise pressing rollers which can e.g. extend over the entire width of the printed circuit board in a direction perpendicular to the transportation direction. Such pressing means are arranged at least along the transport path that feeds the printed circuit boards to the screen printing drums. With a corresponding configuration or arrangement of the pressing means, the latter may also be arranged along the transport path which serves to transport the printed circuit boards away from the screen printing drums. It must here only be ensured that the pressing means do not remove the solder resist, which has e.g. been applied, or that said resist has not already dried before. To this end a corresponding drying means may e.g. be arranged directly along the transport path downstream of the screen printing drums.

The pressing rollers may preferably be supported in a pivotable manner while being adapted to be pressed onto the upper surface of the board in spring-biased fashion. The pressing rolls are preferably supported laterally from the transport path.

To apply solder resist to an increased number of printed circuit boards in the same or also a different manner, a plurality of transport paths for printed circuit boards may be arranged side by side for the parallel supply of printed circuit boards to the screen printing drums. The screen printing drums may here be configured in the area of the various transport paths in a similar manner, so that each of the printed circuit boards supplied in parallel fashion are provided with solder resist in a similar manner. The screen printing drums may also be configured along their rotational axis differently for each transport path, so that different patterns of solder resist can simultaneously be applied to printed circuit boards which are supplied in parallel fashion. Likewise, the printed circuit boards which are supplied in parallel fashion to the screen printing drums may e.g. be provided with the same coating on the upper surface of the board and with different coatings on the lower surface of the board, or vice versa. Moreover, it is possible to print each printed circuit board at one side or both sides repeatedly and in successive fashion with the help of a screen printing drum.

For a simple adjustment of the height of the at least one screen printing drum, a height adjusting means may be provided for automatically adjusting the height. It is thereby possible to lift or lower the adjustable screen printing drum relative to the other screen printing drum by the "push of a button".

In the simplest case the height adjusting means may comprise a height indicating means and a drive for lifting and lowering operations. The height indicating means may e.g. be a scale on which the respective height position of the adjustable screen printing drum can be read. The drive may e.g. comprise a gear which is driven by a motor and which rolls along a substantially vertically arranged toothed rack. Further drives can be implemented in an easy manner.

To further simplify the application device, a drive means may be assigned to both screen printing drums. Such a drive means may e.g. be a motor which is drivingly connected to a screen printing drum, and a drive belt arranged between the two screen printing drums for transmitting the rotational movement to the other screen printing drum. The drive means preferably comprises a motor and a speed controller for synchronizing the rotations of the screen printing drums. It is thereby ensured that the solder resist is applied along the printed circuit boards to the upper and lower surfaces thereof in a correct manner from the beginning to the end.

For instance, in order to easily apply different sizes of printed circuit boards and/or different patterns of solder resist to both sides of printed circuit boards, it is advantageous when the screen printing drums are supported in the application device in such a manner that they are exchangeable. As a result, it is e.g. possible to use screen printing drums having different diameters or different stencils.

To automate the operation of the application device and to simplify the same for a user, the application device may comprise an electronic control unit including at least one microprocessor and a storing means. With the help of the electronic control unit it is possible to request different application programs, and it is e.g. also possible to store differences in the stencils of different installable screen printing drums in the storing means. After a screen printing drum has been replaced, a corresponding application program can e.g. be requested automatically by means of the electronic control unit for different sizes of printed circuit boards or for a different stencil.

To support the screen printing drums in the application device in a simplified manner and to supply the material to be applied, in particular solder resist, in a simplified manner, each screen printing drum may be rotatably supported in a holding means which has adjustably supported thereon a dispenser and application means that can be assigned to an inner circumference of the screen printing drum. The dispenser and application means may contain a tank, or the like, for the material to be applied, with the material being dispensed in quantitatively metered amounts from said tank via a dispenser means and being applicable by means of the application device to an interior side of the stencil of the screen printing drums.

An advantageous embodiment of the present invention shall now be explained and described in more detail with reference to the figures attached to the drawing, in which:

FIG. 1 is a lateral view of the application device 1 according to the invention.

Figure 1:
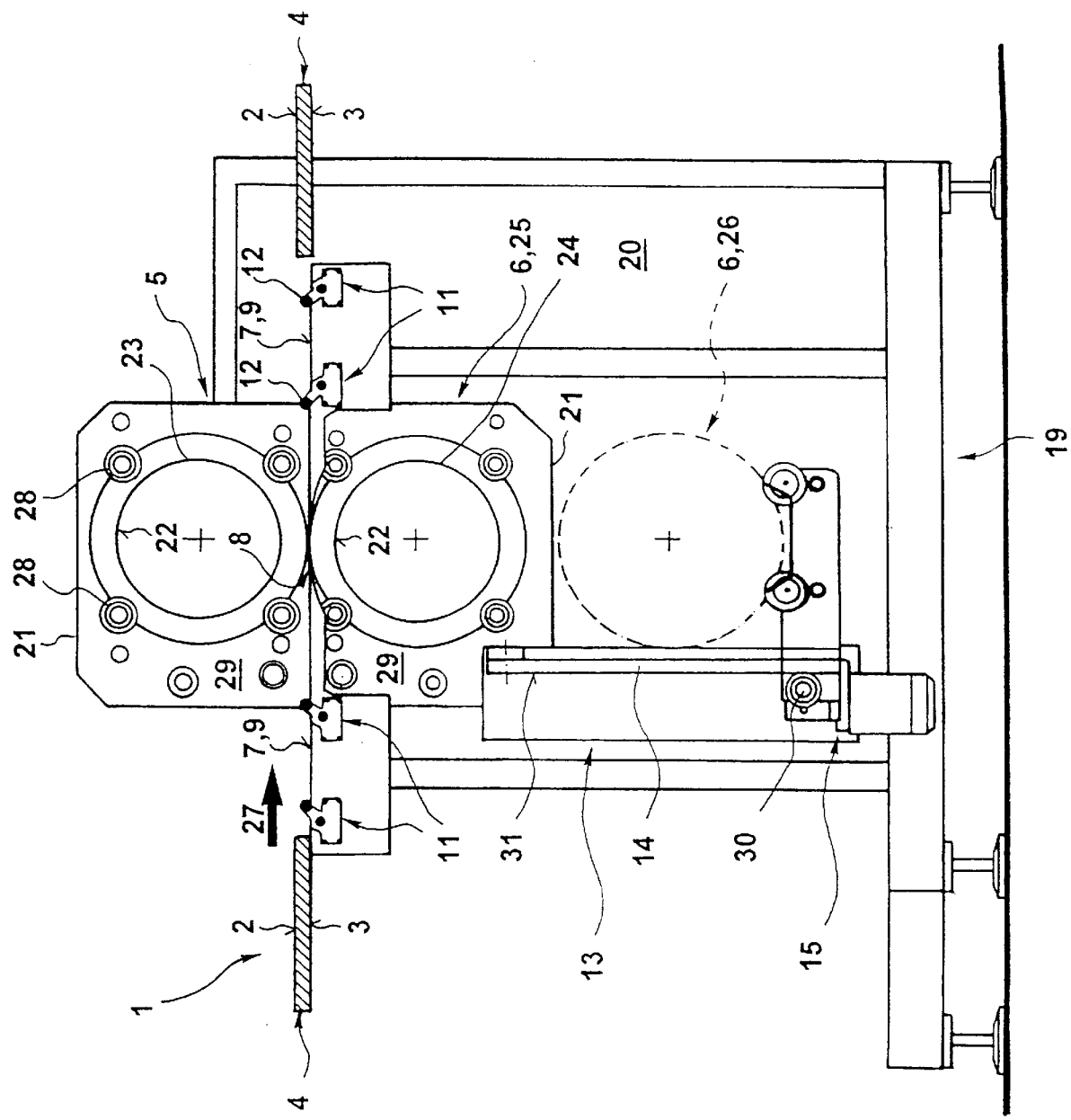
FIG. 1 is a lateral view of an application device according to the invention.

The application device 1 comprises a device frame 19 which is placed on the ground by means of vertically adjustable feet. Two screen printing drums 5, 6 are rotatably supported within the device frame as application bodies. A holding device 21 which comprises holding plates 29 arranged at least at one side in the axial direction of the screen printing drum and holding rods 28 connecting said holding plates to a drive means 16 (see FIG. 2) serves to support the screen printing drums 5, 6.

The two screen printing drums 5, 6 define a printing gap 8 and are arranged at both sides of an essentially horizontal transport path 7 which is predetermined by a transport means 9. Printed circuit boards 4 are movable along the transport path 7 in the transport direction 27 and can be supplied to the printing gap 8.

The screen printing drum 6 which is arranged below the transport path 7 can be lifted and lowered by means of a height adjusting means 13. In the lifted position 25 the screen printing drum 6 forms the printing gap 8 together with the other screen printing drum 5 while in its lowered position 26 it is spaced from the transport path 7 at a maximum distance. The height adjusting means 13 comprises a height indicating device 14, for instance in the form of a scale, as well as a drive 15. Thanks to said drive the screen printing drum 6 is adjustable along the height indicating means 14, for instance by a gear 30 which is connected to a motor as the drive, along a correspondingly toothed rack 31, for example, as part of the height indicating means 14.

A pressing means 11 consisting of a plurality of pivotably supported pressing rolls 12 is arranged along the transport path 7. The pressing rolls can be applied from above to an upper surface 2 of the board. The printed circuit boards 4 are introduced into the printing gap 8 by the transport means 9 and are printed on, for example with a solder resist, by the two screen printing drums 5, 6 on their upper board surface 2 and their lower surface 3 at the same time and in synchronism.

The application device further comprises an electronic control unit 20 which contains at least one microprocessor and a storing means as well as corresponding actuating and display instruments for actuating and monitoring the application device.

Figure 2:
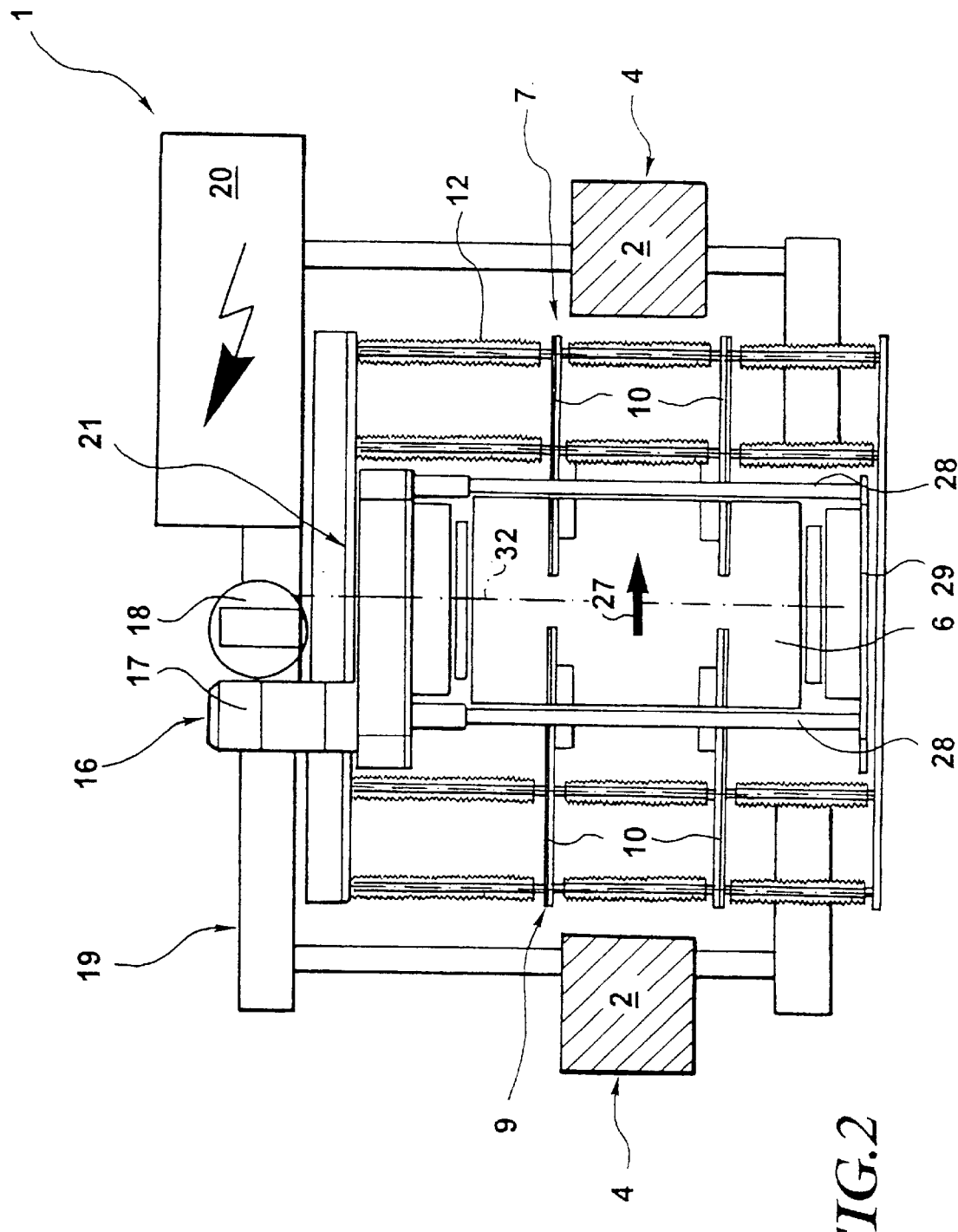
FIG. 2 is a top view on the application device of FIG. 1.

FIG. 2 is a top view on the application device according to FIG. 1; the upper screen printing drum 5 with its holding means 21 has here been omitted for the sake of simplification. Identical parts are provided with identical reference numerals and are only mentioned in part.

The further transport means for feeding or discharging printed circuit boards in the transport direction 25 of the application device 1 are not illustrated for the sake of simplification, nor a heating means which can additionally be arranged in the transport direction behind the screen printing drums 5, 6 for drying the solder resist.

At one side of the holding means 21 of the screen printing drum 6 and of the screen printing drum 5, which is not shown, a drive means 16 is arranged on the device frame 19 for the two screen printing drums. The drive means 16 comprises at least one drive motor 17 and a speed controller 18. The latter simultaneously serves to synchronize the speeds of the two screen printing drums 5, 6. The rotational movement can be transmitted from one screen printing drum to the other one via a belt drive, with corresponding pulleys being assigned to the two screen printing drums on the rotational axes 32 thereof.

Two holding rods 28 and a holding plate 29 can in particular be seen of the holding means 21 of the lower screen printing drum 6. The holding plate 29 is connected by means of the holding rods 28 to the drive means 16 at the other side of the screen printing drum 6. The screen printing drum is rotatably supported on both sides by the holding plate 29 and the drive means 16.

For the sake of simplification, a corresponding dispenser and application device by which, for example, solder resist can be applied in quantitatively dosed amounts along the inner circumference to an interior side of a stencil of the screen printing drum has been omitted in the interior of the screen printing drum.

According to FIG. 2 the transport means 9 comprises a plurality of conveyor belts 10 which support at least small edge portions of the printed circuit boards 4 in parallel with the transport direction 27. For adaptation to different dimensions of printed circuit boards in a direction perpendicular to the transport direction 27 the conveyor belts may also be adjustably supported in a direction perpendicular to the transport direction.

What is claimed is:

1. An application device (1) for applying at least a solder resist onto both surfaces (2, 3) of a printed circuit board (4) wherein the printed circuit boards are provided with structurized printed conductors, the application device comprising at least two application bodies (5, 6) that can be assigned to the corresponding surface (2, 3) of the board and are rotatably supported, wherein the application bodies (5, 6) are two screen printing drums arranged on both sides of an essentially horizontal transport path (7) of the printed circuit board (4), wherein a transport means (9) comprises conveyor belts (10) along the transport path (7) for transporting the printed circuit board, and the transport means (9) further comprises pressing means (11) that can be pressed onto a surface (2) of the board for holding the printed circuit board on the conveyor belts (10).

2. The application device according to claim 1, characterized in that at least one screen printing drum (5, 6) is adjustably supported essentially in a direction perpendicular to the transport path (7).

3. The application device according to claim 1, characterized in that the transport path (7) has assigned thereto the transport means (9) which supports and/or holds at least an edge portion and/or edge of the printed circuit board (4).

4. The application device according to at least claim 1, characterized in that the pressing means (11) comprises pressing rolls (12).

5. The application device according to claim 1, characterized in that the pressing rolls (12) are pivotably supported.

6. The application device according to claim 1, characterized in that a plurality of transport paths (7) for printed circuit boards (4) are arranged side by side for the parallel supply of printed circuit boards to the screen printing drums (5, 6).

7. The application device according to claim 1, characterized in that a height adjusting means (13) is assigned to the adjustably supported screen printing drum (5, 6) for automatically adjusting the height.

8. The application device according to claim 1, characterized in that the height adjusting means (13) comprises a height indicating means (14) and a drive (15) for lifting and lowering the screen printing drum (5, 6).

9. The application device according to claim 1, characterized in that both screen printing drums (5, 6) have assigned thereto a drive means (16).

10. The application device according to claim 1, characterized in that the drive means (16) comprises a motor (17) and a speed controller (18), in particular for synchronizing the rotations of the screen printing drums (5, 6).

11. The application device according to claim 1, characterized in that the screen printing drums are replaceably supported in the application device (1).

12. The application device according to claim 1, characterized in that the application device (1) comprises an electronic control unit (20) including at least one microprocessor and a storing means.

13. An application device (1) for applying at least a solder resist onto both surfaces (2, 3) of a printed circuit board (4) wherein the printed circuit board is provided with structurized printed conductors, the application device comprising at least two application bodies (5, 6) that can be assigned to the corresponding surface (2, 3) of the board and are rotatably supported, wherein the application bodies (5, 6) are two screen printing drums arranged on both sides of an essentially horizontal transport path (7) of the printed circuit board (4), wherein a transport means (9) comprises conveyor belts (10) along the transport path (7) for transporting the printed circuit board, and the transport means (9) further comprises pressing means (11) that can be pressed onto a surface (2) of the board for holding the printed circuit board on the conveyor belts (10), wherein each screen printing drum (5, 6) is rotatably supported in a holding device (21) which has adjustably supported thereon a dispenser and application means that can be assigned to an inner circumference (22) of the screen printing drum (5, 6).

* * * * *